(12) United States Patent
Wang

(10) Patent No.: US 9,715,345 B2
(45) Date of Patent: Jul. 25, 2017

(54) APPARATUSES AND METHODS FOR MEMORY MANAGEMENT

(71) Applicant: Micron Technology, Inc., Boise, ID (US)

(72) Inventor: Qi Wang, Zhabei Zone (CN)

(73) Assignee: Micron Technology, Inc., Boise, ID (US)

( * ) Notice: Subject to any disclaimer, the term of this patent is extended or adjusted under 35 U.S.C. 154(b) by 221 days.

(21) Appl. No.: 14/261,956

(22) Filed: Apr. 25, 2014

(65) Prior Publication Data

US 2015/0309741 A1  Oct. 29, 2015

(51) Int. Cl.
| | |
|---|---|
| *G06F 11/10* | (2006.01) |
| *G06F 3/06* | (2006.01) |
| *G06F 11/14* | (2006.01) |
| *G11C 16/10* | (2006.01) |
| *G11C 16/22* | (2006.01) |
| *G11C 16/34* | (2006.01) |
| *G11C 29/00* | (2006.01) |

(52) U.S. Cl.
CPC ............ *G06F 3/0619* (2013.01); *G06F 3/064* (2013.01); *G06F 3/0688* (2013.01); *G06F 11/1068* (2013.01); *G06F 11/1072* (2013.01); *G06F 11/141* (2013.01); *G11C 16/10* (2013.01); *G11C 16/22* (2013.01); *G11C 16/3418* (2013.01); *G11C 16/3427* (2013.01); *G11C 29/74* (2013.01)

(58) Field of Classification Search
CPC .................................................. G06F 11/1008
USPC ......................................... 714/763, 758, 807
See application file for complete search history.

(56) References Cited

U.S. PATENT DOCUMENTS

| | | | | |
|---|---|---|---|---|
| 3,848,236 | A * | 11/1974 | Troutman | G11C 7/12 365/203 |
| 6,988,175 | B2 | 1/2006 | Lasser | |
| 7,275,140 | B2 | 9/2007 | Paley | |
| 7,926,084 | B1 * | 4/2011 | Harvey | G01R 1/071 348/460 |
| 9,135,164 | B2 * | 9/2015 | Karamcheti | G06F 12/0246 |
| 2010/0107036 | A1 * | 4/2010 | Resnick | G06F 11/1044 714/763 |
| 2012/0271991 | A1 * | 10/2012 | Allen | G06F 12/0246 711/103 |
| 2014/0095810 | A1 * | 4/2014 | Loewenstein | G06F 17/30501 711/148 |
| 2014/0279894 | A1 * | 9/2014 | Loewenstein | G06F 17/30348 707/634 |
| 2014/0281138 | A1 * | 9/2014 | Karamcheti | G06F 12/0246 711/103 |
| 2016/0011640 | A1 * | 1/2016 | Murphy | G06F 1/32 713/323 |

* cited by examiner

*Primary Examiner* — Fritz Alphonse
(74) *Attorney, Agent, or Firm* — Schwegman Lundberg & Woessner, P.A.

(57) ABSTRACT

Some embodiments include apparatuses and methods to select a target memory portion in a first memory location to store information. One such method can conditionally store the information in a second memory location when the information is stored in the target memory portion. Other embodiments are described.

21 Claims, 10 Drawing Sheets

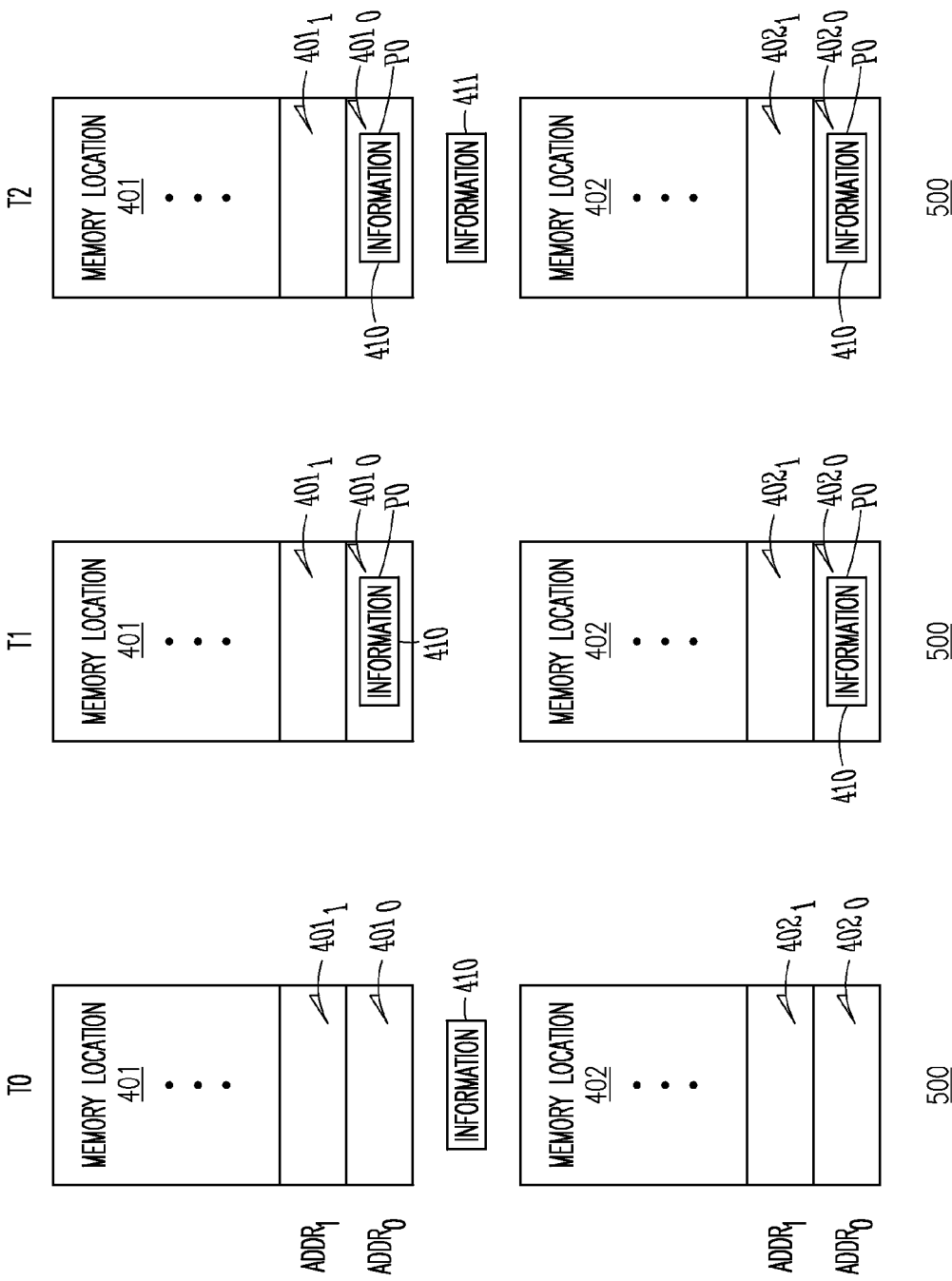

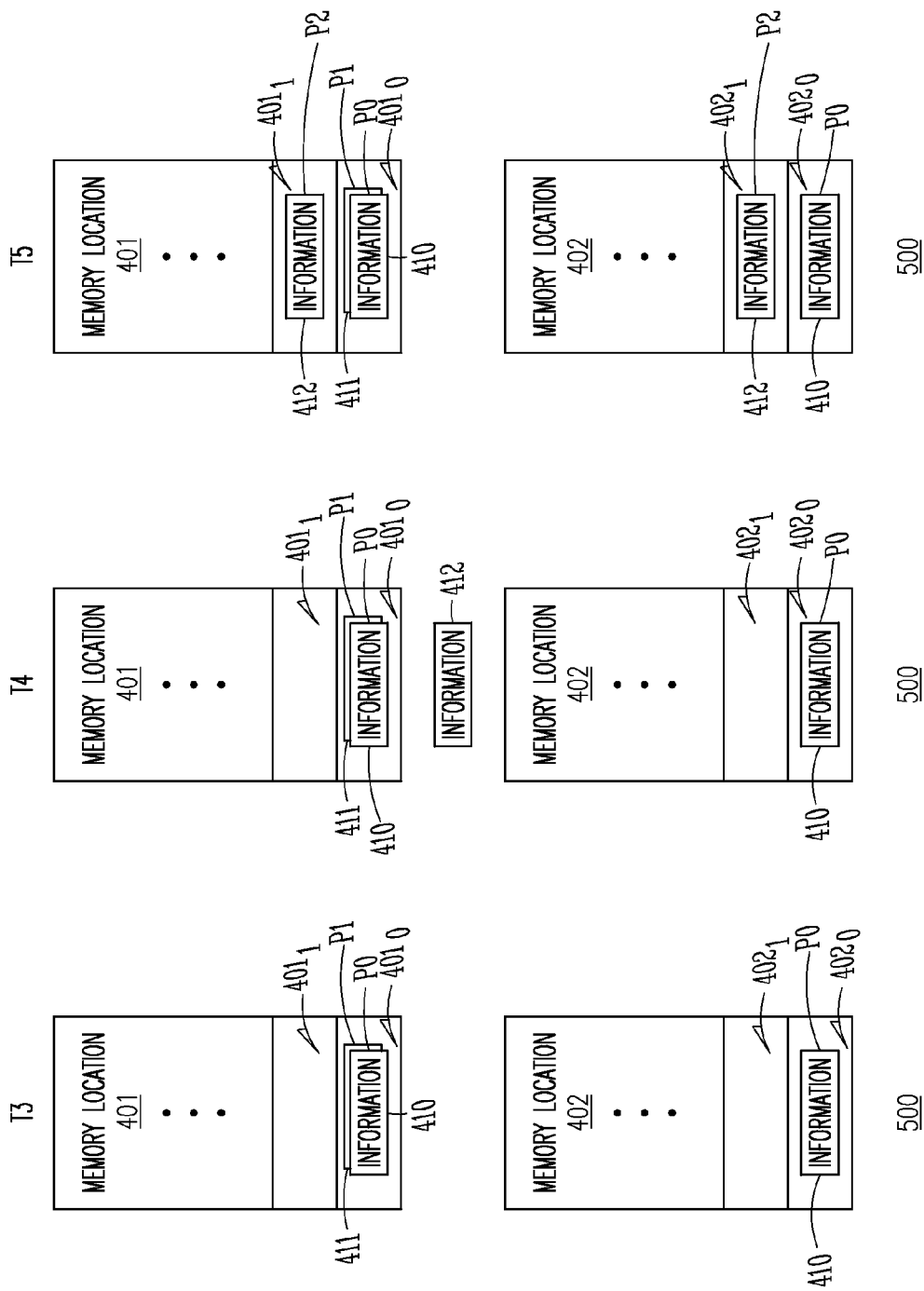

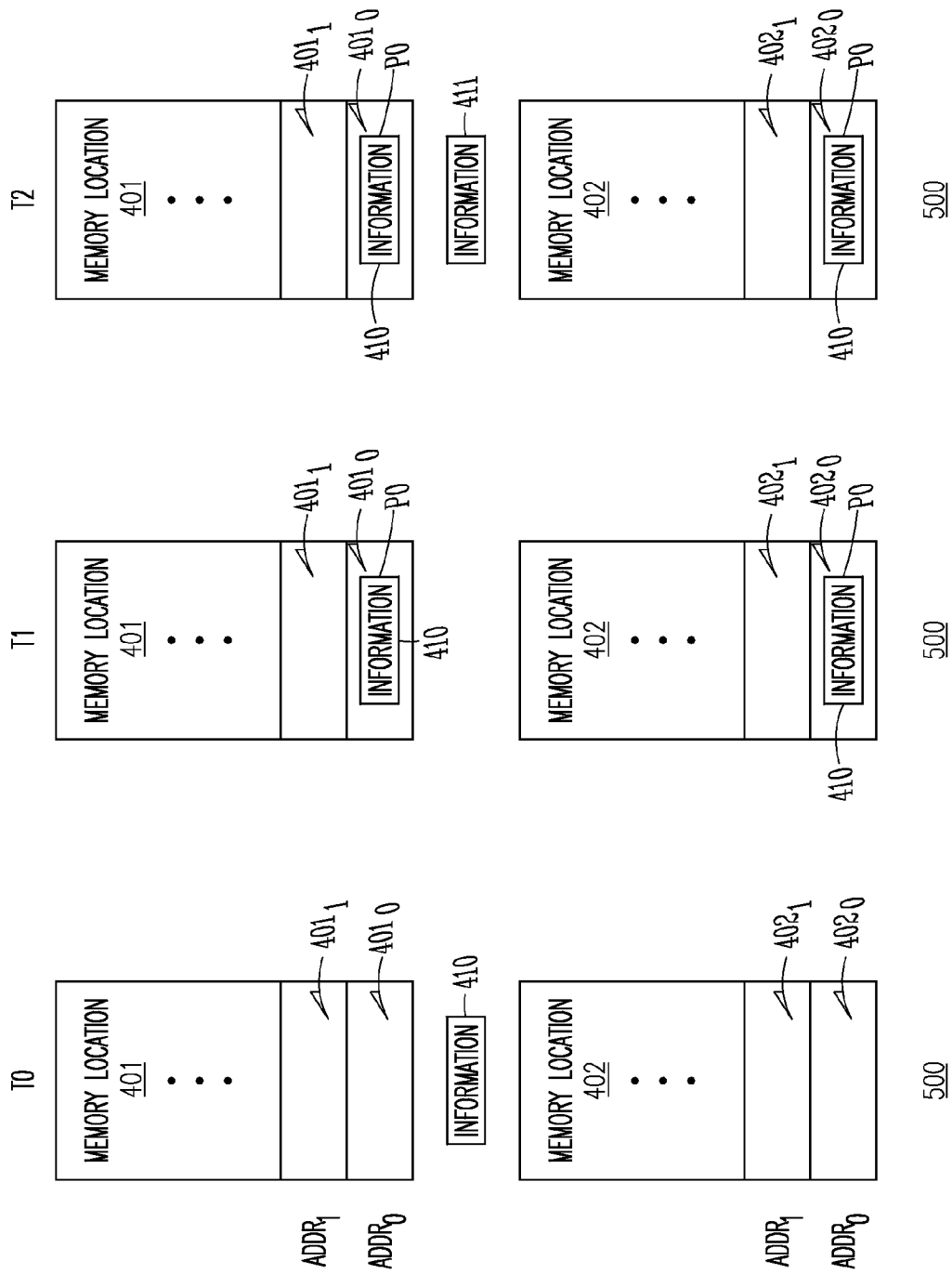

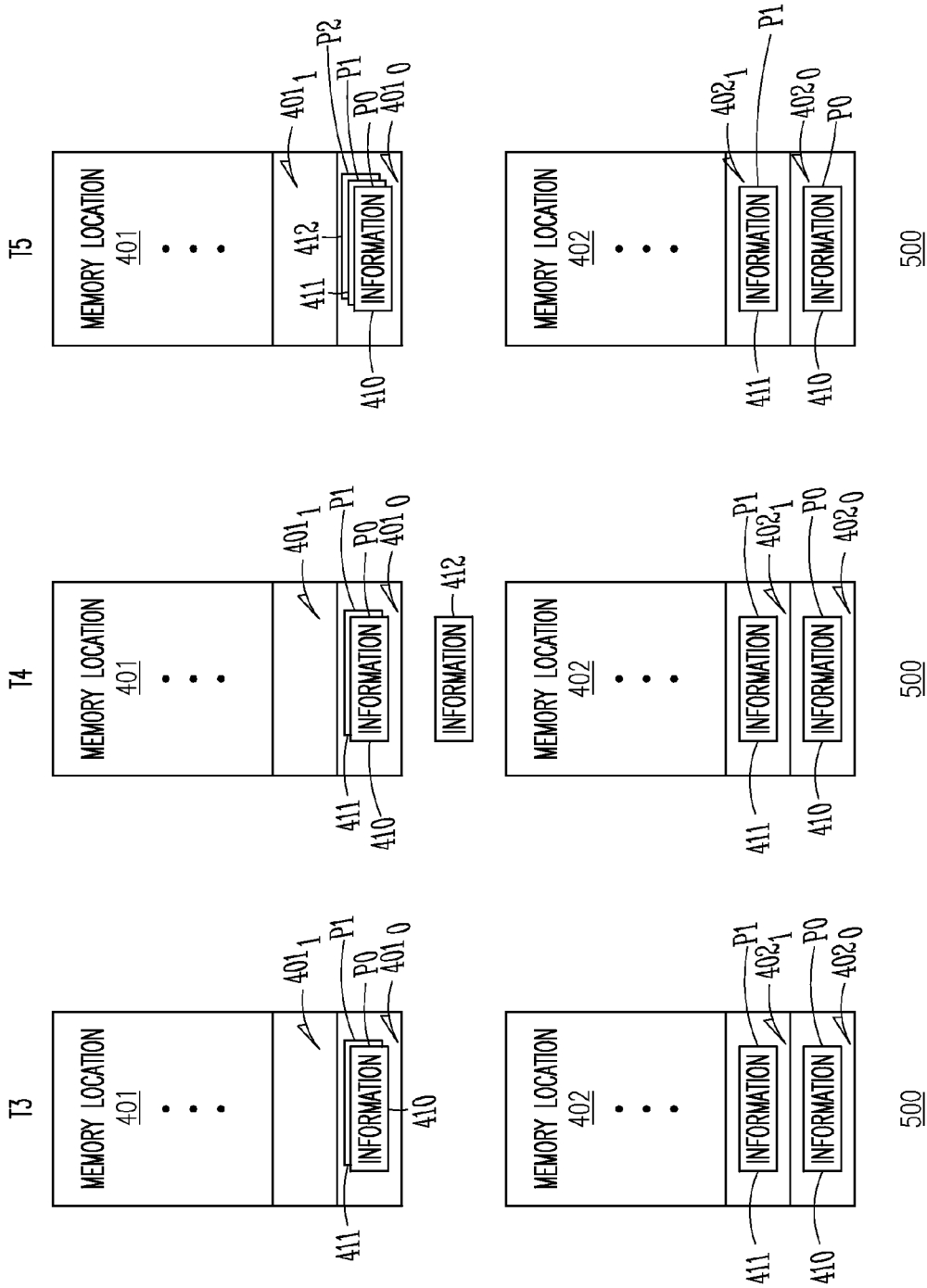

APPARATUSES AND METHODS FOR MEMORY MANAGEMENT

BACKGROUND

Many electronic systems, such as computers and mobile devices, usually include a memory to store information. In some situations, some information already stored in the memory may be corrupted during storing of new information in the memory. Thus, some conventional memory may include techniques to store a backup copy of the information for information recovery purposes. However, some conventional techniques may be inefficient.

BRIEF DESCRIPTION OF THE DRAWINGS

FIG. 5A through FIG. 5F show example stages of storing information in memory locations, according to an embodiment of the invention.

FIG. 6A through FIG. 6F show variations of the examples of information stored in the memory locations of FIG. 5A through FIG. 5F, according to an embodiment of the invention.

DETAILED DESCRIPTION

Figure 1:
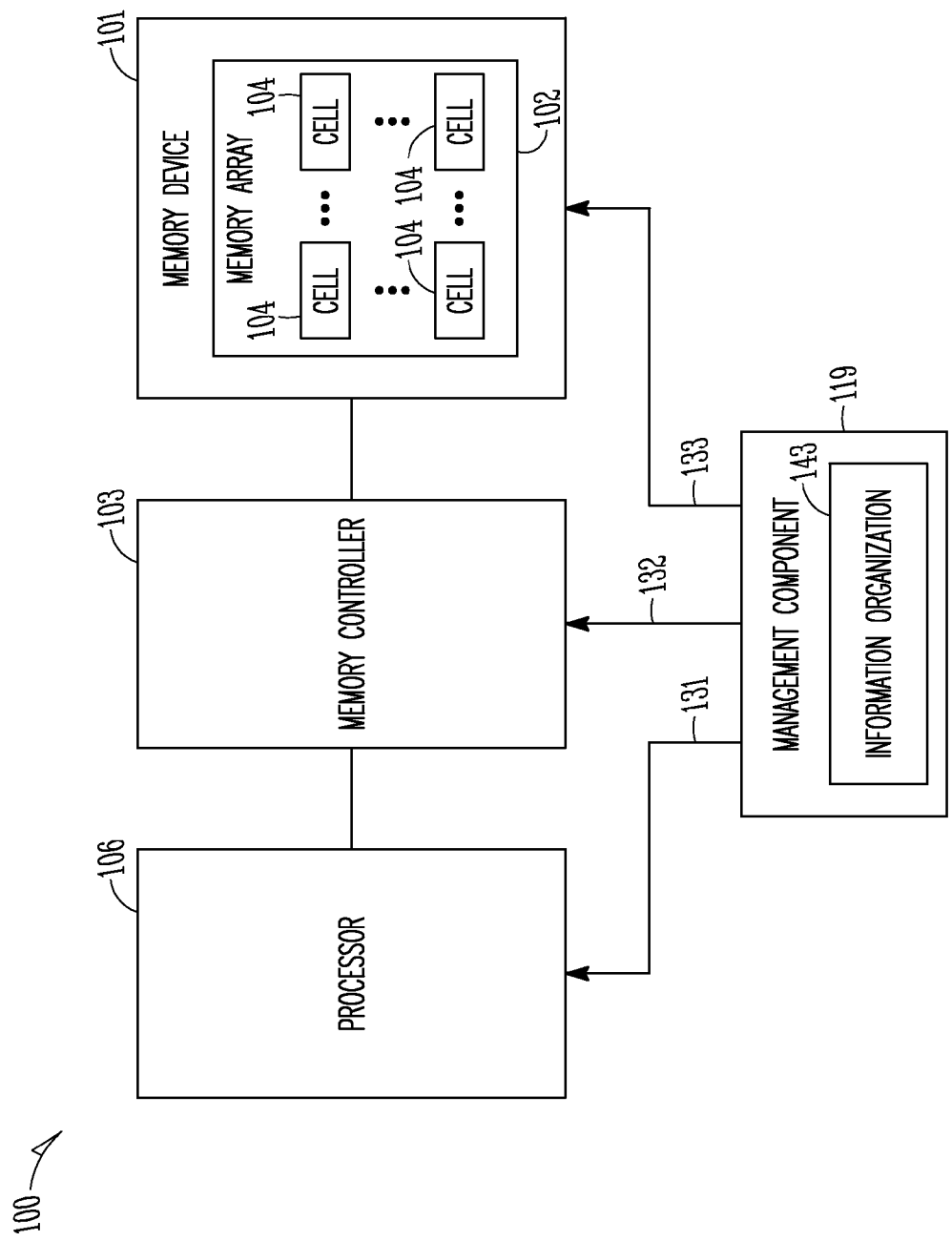
FIG. 1 shows a block diagram of an apparatus, according an embodiment of the invention.

FIG. 1 shows a block diagram of an apparatus 100 according an embodiment of the invention. Apparatus 100 can include a memory device 101 having a memory array 102 and a memory controller 103 to control communication between memory device 101 and a processor 106. Memory array 102 can include memory cells 104 to store information. The information can include data (e.g., data used by a user), control codes (e.g., error correction code (ECC)) generated by apparatus 100 and/or other kinds of information.

Apparatus 100 can also include a management component 119 to perform some of the operations in one or more of memory device 101, memory controller 103, and processor 106. For example, management component 119 can include an information organization 143 to keep track and/or manage information stored in memory device 101. Management component 119 can also perform other functions including determining whether to store the same information in different memory locations in apparatus 100, as described in more detail with reference to FIG. 2 through FIG. 7.

In FIG. 1, arrows 131, 132, and 133 indicate that management component 119 may be included in any combination of memory device 101, memory controller 103, and processor 106. For example, the entire management component 119 may be included in memory device 101, in memory controller 103, or in processor 106. In another example, different portions of management component 119 may be scattered among at least two of memory device 101, memory controller 103, and processor 106. Thus, as an example, one part of management component 119 may be included in memory device 101 and another part of management component 119 may be included in memory controller 103 and/or processor 106. Apparatus 100 may include or be included in embedded memory or embedded system (e.g., embedded multimedia card (eMMC)). Thus, management component 119 can be part of such embedded memory or system.

Management component 119 may include software program instructions, firmware, hardware, or a combination thereof. An example of firmware in management component 119 includes basic input output system (BIOS) circuitry or circuitry similar to BIOS circuitry of an electronic system. An example of hardware in management component 119 includes circuit elements such as flip-flop circuitry, register circuitry, state machine circuitry, and other circuit elements.

Memory device 101 of FIG. 1 may include a non-volatile memory device (e.g., a flash memory device). Each of memory cells 104 can include a multi-level cell (MLC), such that each of memory cells 104 can store more than one bit of information. For example, each of memory cells 104 can store two bits of information that can correspond to one of four possible states (00, 01, 01, and 11) of a combination of two bits. In another example, each of memory cells 104 can store three bits of information that can correspond to one of eight possible states (000, 001, 010, 011, 100, 101, 110, and 111) of a combination of three bits.

Processor 106 may include a general-purpose processor (e.g., a processor used in a computer) or an application specific integrated circuit or ASIC (e.g., a processor used in a cellular phone or a digital camera).

Memory device 101 and memory controller 103 may be formed from the same semiconductor die and enclosed in the same semiconductor package or chip. Memory device 101 and memory controller 103 may also be formed from separate semiconductor dice and enclosed in separate semiconductor packages or separate chips.

Figure 2:
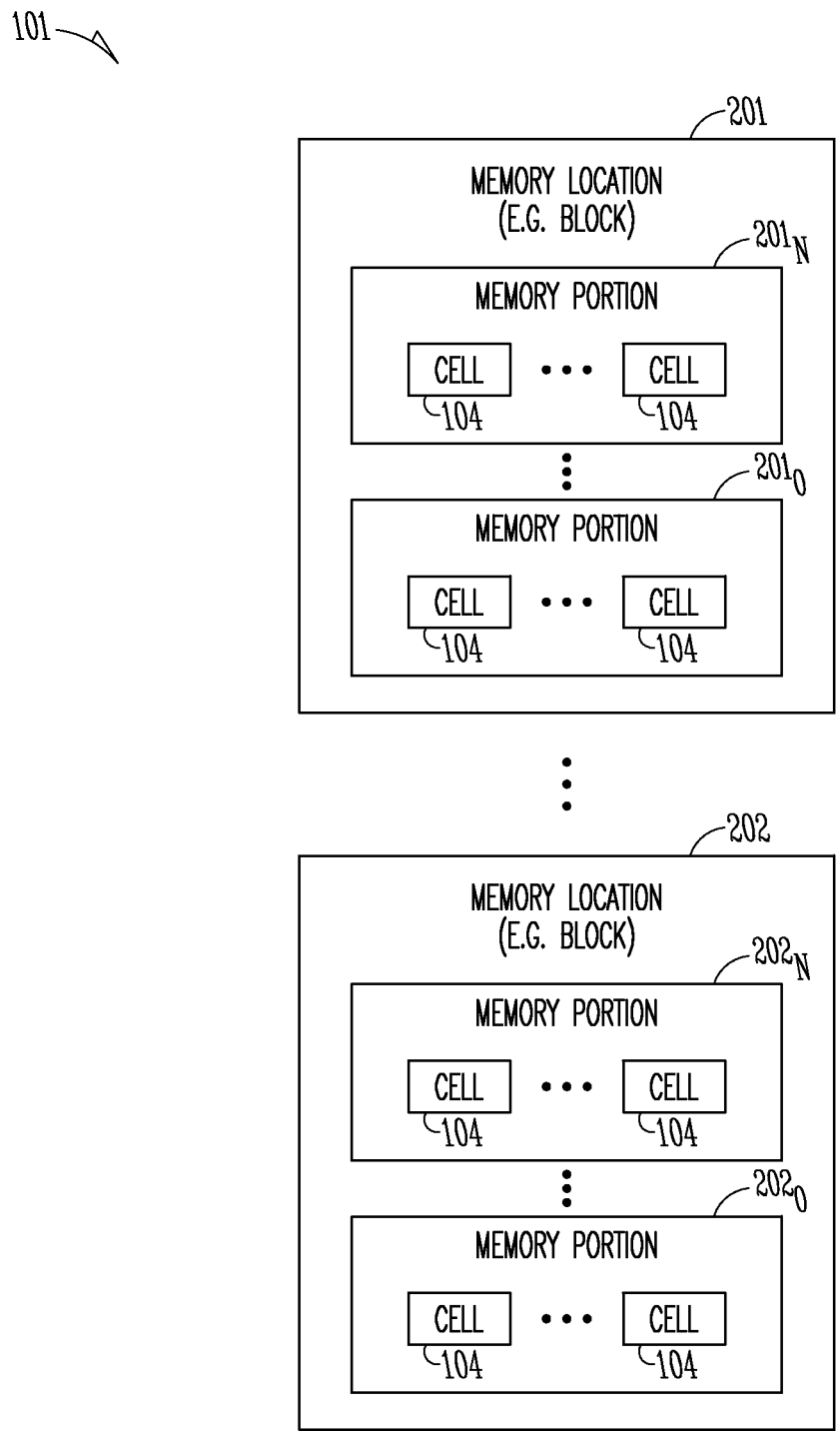
FIG. 2 shows a portion of a memory device including memory locations, according to an embodiment of the invention.

FIG. 2 shows a portion of memory device 101 of FIG. 1 including memory locations 201 and 202, according to an embodiment of the invention. Each of memory locations 201 and 202 can include a memory block of memory device 101. As shown in FIG. 2, memory locations 201 and 202 can include memory portions $201_0$ through $201_N$ and memory portions $202_0$ through $202_N$, respectively. Each of these memory portions can include a number of memory cells 104 to store information. During an operation (e.g., a write operation) of storing information in memory device 101, memory portions $201_0$ through $201_N$ can be selected as target memory portions to store the information. In some cases, information stored in a particular memory portion in memory location 201 in one write operation may be susceptible to being corrupted when information in another write operation is also stored in that particular memory portion. The value of the information may be undefined when the information is corrupted. If the information is determined to be susceptible to being corrupted, management component 119 (FIG. 1) may operate to cause the information to be stored in both memory locations 201 and 202. This may allow recovery of the information stored in memory location 201 if it becomes corrupted. If the information stored in memory location 201 is corrupted, the information in memory location 202 can be retrieved to replace the corrupted information in memory location 201.

Figure 3:
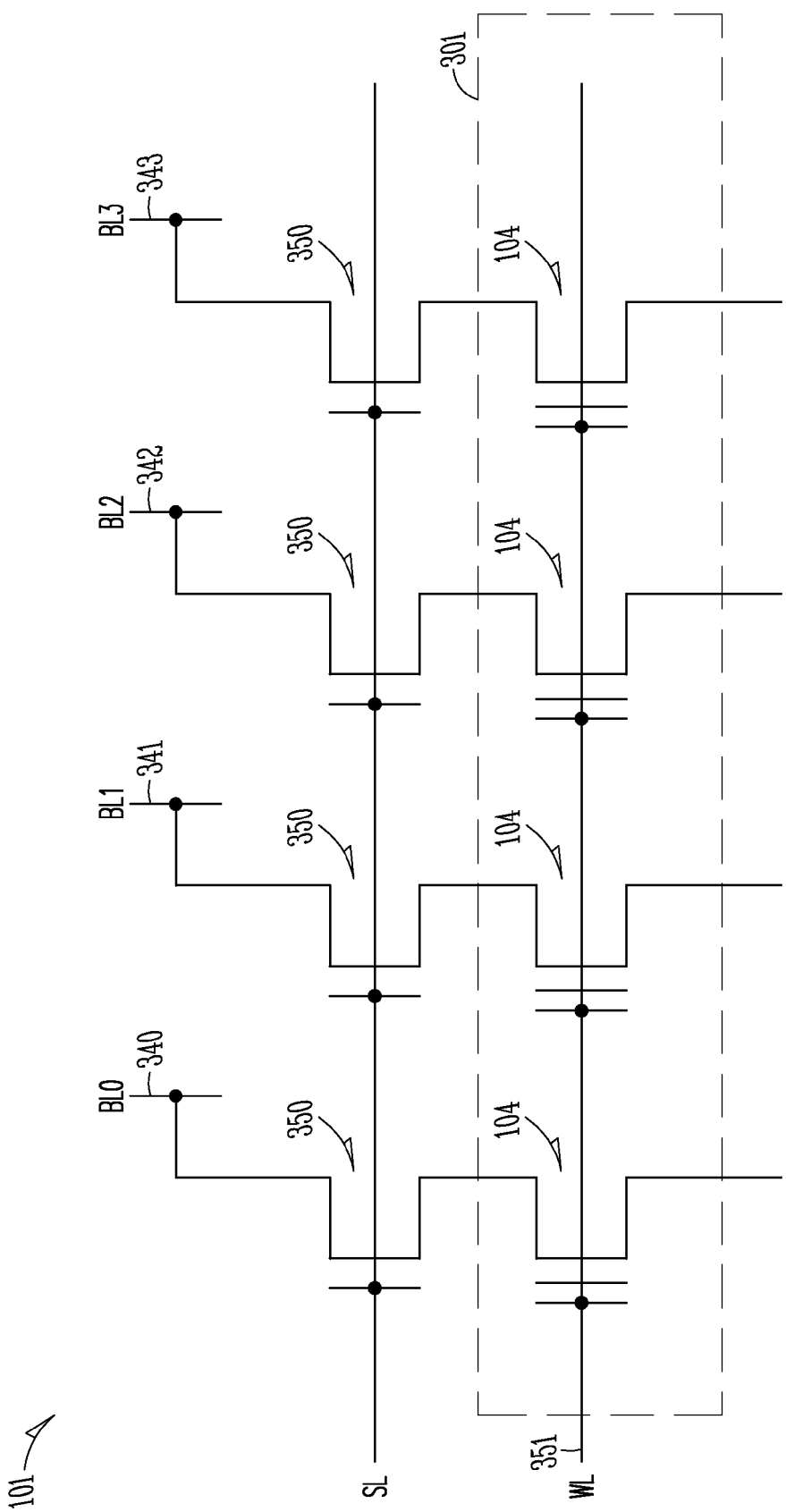
FIG. 3 shows a schematic diagram of a memory portion of the device of FIG. 2, according to an embodiment of the invention.

FIG. 3 shows a schematic diagram of a memory portion 301 of memory device 101 of FIG. 2, according to an embodiment of the invention. Memory portion 301 in FIG. 3 can correspond to one of memory portions $201_0$ through $201_N$ or one of memory portions $202_0$ through $202_N$ of FIG. 2. As shown in FIG. 3, memory portion 301 can include an access line (e.g., word line) 351, data lines (e.g., bit lines) 340, 341, 342, and 343, and transistors (e.g., select transistors 350). Memory cells 104 in memory portion 301 can share the same access line 351. A signal (e.g., word line signal) WL on access line 351 can be used to access (simultaneously access) memory cells 104 during an operation (e.g., a write operation) to store information in memory cells 104. A signal (e.g., select signal) SL can be used to turn on transistors 350 to couple memory cells 104 to respective data lines 340, 341, 342, and 343. Signals BL0, BL1, BL2, and BL3 on data lines 340, 341, 342, and 343, respectively, can be used to provide information to be stored in memory cells 104. Bits of information can be stored (e.g., simultaneously stored) in respective memory cells 104 through data lines 340, 341, 342, and 343.

FIG. 4A through FIG. 4D show block diagrams of information organization 403 associated with the information stored in memory locations 401 and 402, according to an embodiment of the invention. Memory locations 401 and 402 can be included in the same device (e.g., memory device 101 in FIG. 1). Alternatively, memory locations 401 and 402 can be included in different devices, such that one memory location (e.g., memory location 401) can be included in one device (e.g., memory device 101) and memory location 402 can be included in another device (e.g., memory controller 103, or processor 106, or another memory device not shown in FIG. 1).

Information organization 403 in FIG. 4 can include information organization 143 of FIG. 1 and can be managed (e.g., created and/or maintained) by a management component, such as management component 119 in FIG. 1. Information (e.g., bits of data) physically stored in memory locations 401 and 402 (FIG. 4B) can be logically organized into units. Examples of such units can include pages $P_0$ to $P_Z$ in information organization 403 (FIG. 4A). Each of pages $P_0$ through $P_Z$ can be assigned a unique address (e.g., logical address) among addresses $A_0$ through $A_Z$. For example, pages $P_0$, $P_1$, $P_2$, $P_3$, $P_4$, and $P_Z$ can be assigned addresses $A_0$, $A_1$, $A_2$, $A_3$, $A_4$, and $A_Z$, respectively.

Pages $P_0$ through $P_Z$ can have the same page size. The page size can be a smallest amount of information (e.g., programmable amount) that can be stored in a memory location (e.g., memory location 401 in FIG. 4B) at a time. For example, the page size of each of pages $P_0$ through $P_Z$ can be 2K bytes ($2^{10}$ bytes) of information (e.g., data) plus any extra amount (e.g., bytes) of extra information (e.g., control codes, ECC, and/or other information). A page size of 2K of information is used as an example. The page size can have another value.

Different information stored in a memory location (e.g., memory location 401 in FIG. 4B) can be associated with different pages among pages $P_0$ through $P_Z$. This may allow the information and pages to be managed (e.g., tracked and retrieved). Based on information organization 403, the management component (e.g., management component 119 in FIG. 1) can determine which of pages $P_0$ through $P_Z$ are available (e.g., unused) and which of pages $P_0$ through $P_Z$ are unavailable (e.g., unused). An available page includes a page that has not been associated with information stored in memory location 401. An unavailable page includes a page that has already been associated with information stored in memory location 401.

Memory location 401 can include memory portions $401_0$ through $401_N$. Each of memory portions $401_0$ through $401_N$ can store information associated with one page or multiple pages of information. Information organization 403 may also allow the management component to determine which of memory portions $401_0$ through $401_N$ is available or unavailable to store information, as discussed in more detail below.

Figure 4A:
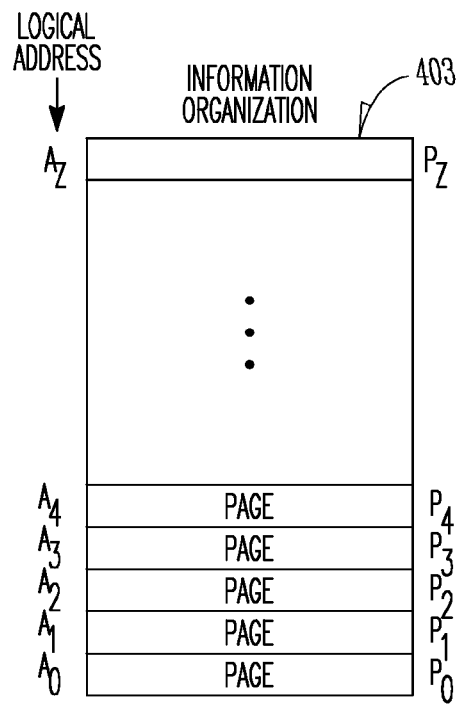
FIG. 4A through FIG. 4D show block diagrams of information organization associated with information stored in memory locations, according to an embodiment of the invention.
Figure 4B:
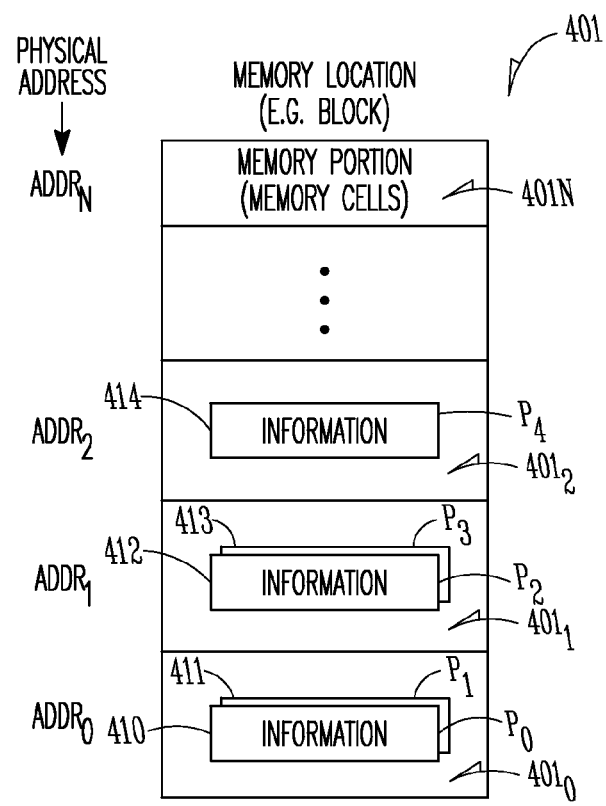

Memory location 401 in FIG. 4B can include a memory block (e.g., a memory block in memory device 101 in FIG. 1). Each of memory portions $401_0$ through $401_N$ can include memory cells (not shown) to store information. The memory cells in each of memory portions $401_0$ through $401_N$ can include memory cells similar to, or identical to, memory cell 104 of FIG. 1, FIG. 2, and FIG. 3.

As shown in FIG. 4B, each of memory portions $401_0$ through $401_N$ can be assigned with a unique address (e.g., physical address) among addresses $ADDR_0$ through $ADDR_N$. For example, memory portion $401_0$, $401_1$, $401_2$, and $401_Z$ can be assigned with address $ADDR_0$, $ADDR_1$, $ADDR_2$, and $ADDR_N$, respectively. Information stored in memory location 401 can be tracked by addresses $ADDR_0$ through $ADDR_N$.

The management component associated with memory location 401 may include a mapping between addresses $A_0$ through $A_Z$ in information organization 403 and addresses $ADDR_0$ through $ADDR_N$ in memory location 401. The mapping may allow information associated with the pages to be tracked and retrieved.

Each of memory portions $401_0$ through $401_N$ can store multiple pages of information at different times in the same memory portion. For example, one page of information can be stored in a particular memory portion (e.g., one of memory portions $401_0$ through $401_N$) in one write operation, and one page of different information can be stored in that particular memory portion in another write operation.

FIG. 4B shows an example where each of memory portions $401_0$ through $401_N$ can store up to two pages of information. For example, information 410 and 411 associated with pages $P_0$ and $P_1$, respectively, can be stored in the same memory portions $401_0$. Information 412 and 413 associated with pages $P_2$ and $P_3$, respectively, can be stored in the same memory portions $401_1$. Information 414 associated with page $P_4$, respectively, can be stored in the same memory portions $401_2$.

Figure 4C:
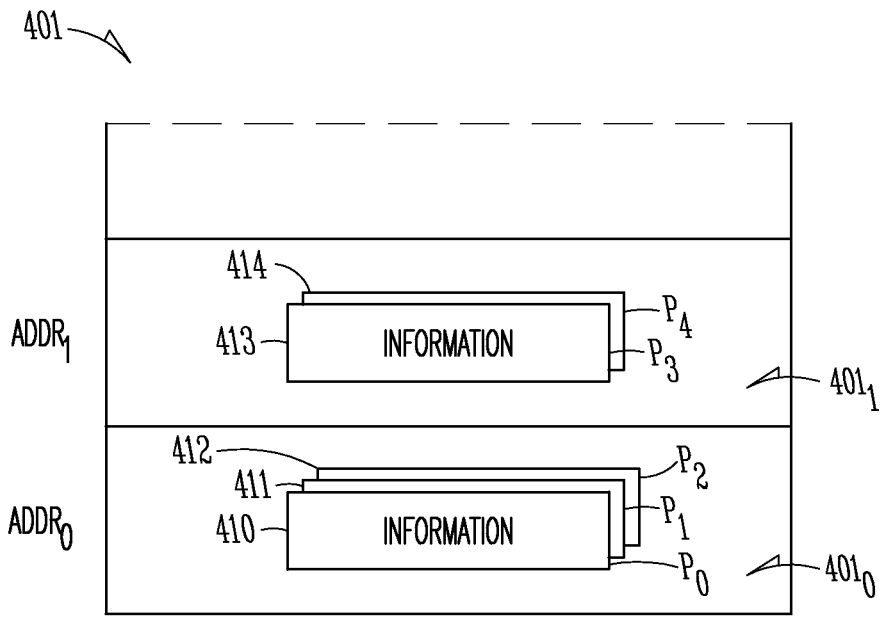

FIG. 4C shows another example where each of memory portions $401_0$ through $401_N$ of memory location 401 can store up to three pages of information. For example, information 410, 411, and 412 associated with pages $P_0$, $P_1$, and $P_2$, respectively, can be stored in the same memory portions $401_0$. Information 413 and 414 associated with pages $P_3$ and $P_4$, respectively, can be stored in the same memory portions $401_1$.

In each of memory portions $401_0$ through $401_N$, information associated with multiple pages can be stored in different stages. The stages may not be performed immediately one after another. For example, in FIG. 4B, information 410 and 411 can be stored in memory portion $401_0$ in two stages. Information 410 (associated with page $P_0$) can be stored in memory portion $401_0$ in one stage (e.g., in one write operation), then information 411 (associated with page $P_1$) can be stored in memory portion $401_0$ in another stage (e.g., in another write operation) after information 410 is stored. In the example shown in FIG. 4C, information 410, 411, and 412 (associated with page $P_0$, $P_1$, and $P_2$, respectively) can be stored in memory portion $401_0$ in three stages (e.g., in three different write operations).

In FIG. 4B, since up to two pages of information can be stored in a memory portion, a page of information stored in a particular memory portion may be referred to as a lower page or an upper page of information depending on the order in which the information associated with that page is stored in that particular memory portion. For example, in memory portion $401_0$ in FIG. 4B, page $P_0$ (associated with information 410) may be referred to as a lower page and page $P_1$ (associated with information 411) can be referred to as an upper page. Similarly, page $P_2$ and page $P_3$ may be referred to as a lower page and an upper page, respectively. Page $P_4$ may be referred to as a lower page. Thus, in this example, in the same memory portion, the lower page (e.g., $P_0$) of information can be stored before the upper page (e.g., $P_1$) of information is stored. In some cases, the storing order may be reversed.

In FIG. 4C, since up to three pages of information can be stored in a memory portion, a page of information stored in a particular memory portion may be referred to as a lower page, a middle page, or an upper page of information. For example, in memory portion $401_0$ in FIG. 4C, pages $P_0$, $P_1$, and $P_2$ may be referred to as lower, middle, and upper pages, respectively. Page $P_3$ and $P_4$ may be referred to as lower and middle pages, respectively. Thus, in this example, in the same memory portion, the lower page (e.g., $P_0$) of information can be stored before other pages (e.g., $P_1$ and $P_2$) of information are stored.

Each of memory portions $401_0$ through $401_N$ can have a storage capacity, which can be the maximum amount of information that can be stored in each memory portion. As shown in FIG. 4B, each of memory portions $401_0$ through $401_N$ can store up to two pages of information. Thus, in FIG. 4B, the storage capacity of each of memory portions $401_0$ through $401_N$ can be two pages of information. In FIG. 4C, the storage capacity of each of memory portions $401_0$ through $401_N$ can be three pages of information.

The management component (e.g., management component 119 in FIG. 1) associated with memory location 401 can determine the status of the storage capacity of each of memory portions $401_0$ through $401_N$ (e.g., based at least in part on information organization 403 in FIG. 4A). The status of the storage capacity can indicate whether a particular memory portion has or has not reached its storage capacity. The status of the storage capacity in each memory portion $401_0$ through $401_N$ may allow the management component to determine whether a particular memory portion among memory portions $401_0$ through $401_N$ is available or unavailable to store information or to store more information (e.g., new information) in addition to any information already stored in that particular memory portion.

For example, if a particular memory portion has reached its storage capacity, then no more information may be stored in that particular memory portion in addition to the information already stored in that particular memory portion. If a particular memory portion has not reached its storage capacity, then information (or more information in addition to the information already stored in that particular memory portion) can be stored in that particular memory portion. For example, in FIG. 4B, each of memory portions $401_0$ and $401_1$ has reached its storage capacity. Thus, no more information can be stored in memory portions $401_0$ and $401_1$ in addition to information (410, 411, 412, and 413) already stored therein. Memory portion $401_2$ has not reached its storage capacity. Thus, another page (e.g., an upper page) of information can be stored in memory portion $401_2$ in addition to information 414 (associated with page $P_4$ (e.g., lower page)) already stored therein.

Each of memory portions $401_0$ through $401_N$ can include multi-level cells (e.g., memory cells 104), such that each of the memory cells can store more than one bit (e.g., two bits or three bits) of information. Thus, in FIG. 4B, if each of the memory cells in memory portions $401_0$ through $401_N$ can store up to two bits of information, then one bit of information associated with one page can be stored in one particular memory cell (e.g., one memory cell 104 in FIG. 1, FIG. 2, or FIG. 3) and another bit of information associated with another page can be stored in that same particular memory cell. For example, in memory portion $401_0$, one bit of information 410 (associated with page $P_0$) can be stored in a particular memory cell of memory portion $401_0$ and another bit of information 411 (associated with page $P_1$) can be stored in that same particular memory cell of memory portion $401_0$. Similarly, in another example, in memory portion $401_1$, one bit of information 412 (associated with page $P_2$) can be stored in one particular memory cell of memory portion $401_1$ and another bit of information 413 (associated with page $P_3$) can be stored in that same particular memory cell of memory portion $401_1$.

In FIG. 4C, if each of the memory cells of memory portions $401_0$ through $401_N$ can store up to three bits of information, then three bits of three different information (associated with three different pages) can be stored in the same memory cell of a particular memory portion. For example, in memory portion $401_0$, one bit of information 410 (associated with page $P_0$), one bit of information 411 (associated with page $P_1$), and one bit of information 412 (associated with page $P_2$) can be stored in the same memory cell of memory portion $401_0$. Similarly, in another example, in memory portion $401_1$, one bit of information 413 (associated with page $P_3$) and one bit of information 414 (associated with page $P_4$) can be stored in the same memory cell of memory portion $401_1$.

Figure 4D:
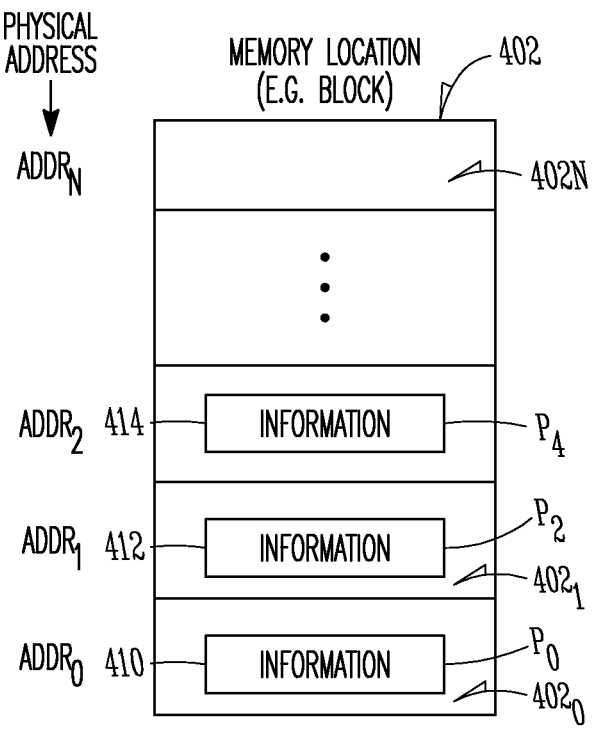

As shown in FIG. 4D, memory location 402 can include memory portions $402_0$ through $402_N$ and corresponding addresses (e.g., physical address) $ADDR_0$ through $ADDR_N$. Each of memory portions $402_0$ through $402_N$ can be used store some of the information associated with one or more pages that are also stored in memory location 401 of FIG. 4B. For example, as shown in FIG. 4D, information 410 associated with page $P_0$ can be stored in memory portion $402_0$. Information 412 associated with page $P_2$ can be stored in memory portion $402_1$. Information 414 associated with page $P_4$ can be stored in memory portion $402_3$.

FIG. 4D shows an example where information associated with different pages (e.g., pages $P_0$, $P_1$, and $P_2$) can be store in different memory portions (e.g., $401_0$, $401_1$, and $401_2$). Alternatively, two or more pages of information can be stored in the same memory portion of memory location 402.

As shown in FIG. 4B and FIG. 4D, only some of information (e.g., information associated with page $P_0$, $P_2$, and $P_4$) stored in memory location 401 is also stored in memory location 402. Memory location 401 may operate as a primary memory location (e.g., a primary block of memory) to store information. Memory location 402 may be used as a backup memory location (e.g., a log memory location) to store some of the information that is stored in memory location 401. Information stored in memory location 402 may be considered as backup information. The management component associated with memory locations 401 and 402 can determine which information is to be stored in memory location 402 based on whether a condition is met. The condition can include a determination of whether the information to be stored in memory location 401 is susceptible to being corrupted (e.g., at risk) when additional information is subsequently stored in memory location 401. For example, the condition is met if the information to be stored in memory location 401 is determined to be susceptible to being corrupted. The condition is not met if the information to be stored in memory location 401 is determined to be not susceptible to being corrupted. If the condition is met, the information (e.g., 410, 412, and 414 in FIG. 4B) can be stored in both memory locations 401 and 402. If the condition not met, the information (e.g., 411 and 413 in FIG. 4B) can be stored in memory location 401 without storing the information in memory location 402.

Corruption of information may be caused by an event such as programming interruption, programming failure, or power loss that may occur during an operation of storing the additional information in the target memory portion. For example, the information to be stored may include information associated with a lower page. In this example, if the information is stored in a target memory portion, the information may be susceptible to being corrupted if information (new information) associated with an upper page (or a middle page) is subsequently stored in that same target memory portion because an event (e.g., programming interruption, programming failure, and power loss) causing the corruption may occur.

FIG. 5A through FIG. 5F show example stages of storing information in memory locations 401 and 402, according to an embodiment of the invention. Memory locations 401 and 402 can be included in a same device 500. Alternatively, memory locations 401 and 402 can be included different devices. Device 500 of FIG. 5A through FIG. 5F can include a memory device, such as memory device 101 shown in FIG. 1, FIG. 2, and FIG. 3. For simplicity, only part of device 500 (e.g., memory location 401 and memory location 402) is shown in FIG. 5A through FIG. 5F.

In the examples associated with FIG. 5A through FIG. 5F described below, it is assumed that up to two pages of information can be stored in each of the memory portions (e.g., $401_0$ and $401_1$) of memory location 401. Thus, the storage capacity of each of the memory portions (e.g., $401_0$ or $401_1$) in memory location 401 is two pages of information in these examples.

The following description describes examples of storing information 410, 411, and 412 in memory location 401. Information 410, 411, and 412 can also be conditionally stored in memory location 402 when information 410, 411, and 412 are stored in memory location 402. Conditionally storing information in a memory location (e.g., memory location 402) means that such information can be either stored or not stored in that memory location based on a determination of whether or not a condition is met.

As shown in FIG. 5A through FIG. 5F, different information 410, 411, and 412 can be stored in device 500 at different stages from time T0 through time T5. Times T0 through T5 can occur sequentially. For example, time T0 can occur before time T1. Time T1 can occur before time T2, and so on.

Information 410, 411, and 412 in FIG. 5A through FIG. 5F are the same as those shown in FIG. 4A and FIG. 4B.

FIG. 5A shows information 410 at time T0 to be stored in memory location 401. At time T0, memory portion $401_0$ has not reached its storage capacity. Thus, memory portion $401_0$ is available to store information. Therefore, memory portion $401_0$ can be selected as a target memory location to store information 410. A determination can be made (e.g., at time T0) to determine whether information 410 is susceptible to being corrupted during storing of more information in memory location 401. As shown in FIG. 5A, memory portion $401_0$ has no information stored therein. Since the storage capacity of memory portion $401_0$ is assumed to be two pages of information, the storage capacity of memory portion $401_0$ is not reached even after (e.g., after time T1) information 410 (associated with page $P_0$) is stored in memory portion $401_0$. Thus, memory portion $401_0$ can be available to store more information after information 410 is stored in it. Therefore, memory portion $401_0$ can be selected again at another time (e.g., time T2) as a target memory location to store additional information (e.g., information 411) in addition to information 410. However, storing additional information in the same memory portion $401_0$ after information 410 is stored in memory portion $401_0$ may corrupt information 410. Thus, at time T0, information 410 can be determined to be susceptible to being corrupted. Therefore, at time T0, the condition to store information 410 in memory location 402 is met. Thus, in addition to storing information 410 in memory location 401, information 410 can also be stored in memory location 402. FIG. 5B shows information 410 after it is stored in memory portion $401_0$ of memory location 401 and in memory portion $402_0$ of memory location 402. Information 410 can be stored in memory location 402 concurrently with the storing of information 410 in memory location 401. For example, at time T1, information 410 can be concurrently stored in both memory locations 401 and 402.

FIG. 5C shows information 411 at time T2 to be stored in memory location 401. Since the storage capacity of memory portion $401_0$ is not reached at time T2, memory portion $401_0$ is available to store more information. Thus, memory portion $401_0$ can be selected as a target memory location to store information 411 in addition to information 410. A determination can be made (e.g., at time T2) to determine whether information 411 is susceptible to being corrupted during storing of more information in memory location 401. Since the storage capacity of memory portion $401_0$ is assumed to be two pages of information, memory portion $401_0$ may reach its storage capacity after information 411 (associated with page $P_1$) is stored in memory portion $401_0$. Thus, memory portion $401_0$ can be unavailable to store more information after information 411 is stored therein. Therefore, memory portion $401_0$ may not be selected as a target memory location to store more information (e.g., information 412) in addition to information 410 and 411. Thus, information 411 to be stored in memory location 401 can be determined to be not susceptible to being corrupted (e.g., may be safe from corruption). Therefore, at time T2, the condition to store information 411 in memory portion 402 is not met. Thus, as shown in FIG. 5D, information 411 can be stored (e.g., at time T3) in memory portion $401_0$ of memory location 401 without storing information 411 in memory location 402.

FIG. 5E shows information 412 at time T4 to be stored in memory location 401. Since memory portion $401_0$ already stores two pages (e.g., $P_0$ and $P_1$) of information (e.g., 410 and 411), memory portion $401_0$ has reached its storage capacity. Thus, memory portion $401_0$ is unavailable to store more information. Therefore, memory portion $401_0$ may not be selected as a target memory location to store information 412. Thus, another memory portion of memory location 401 that is available (e.g., that has not reached its storage capacity) can be selected a target memory location to store information 412. For example, in FIG. 5E, memory portion $401_1$ can be selected as target memory location to store information 412.

A determination can be made (e.g., at time T4) as to whether information 412 is susceptible to being corrupted during storing of more information in memory location 401. Similar to the situation for storing information 410 (FIG. 5A and FIG. 5B), information 412 can be determined (e.g., at time T4) to be susceptible to being corrupted. For example, as shown in FIG. 5E, memory portion $401_1$ has no information stored therein. Thus, memory portion $401_1$ can be available to store more information after information 412 is stored in it. Therefore, memory portion $401_1$ can be selected again another time (e.g., after time T4) as a target memory location to store additional information in addition to information 412. However, storing additional information in the same memory portion $401_1$ after information 412 is stored in memory portion $401_1$ may corrupt information 412. Thus, at time T4, information 412 can be determined to be susceptible to being corrupted. Therefore, at time T4, the condition to store information 410 in memory location 402 is met. Thus, in addition to storing information 412 in memory location 401, information 412 can also be stored in memory location 402. FIG. 5F shows information 412 (associated with page $P_2$) after it is stored in memory portion $401_1$ of memory location 401 and memory portion $402_1$ of memory location 402. Information 412 can be stored in memory location 402 concurrently with the storing of information 412 in memory location 401. For example, at time T4, information 412 can be concurrently stored in both memory locations 401 and 402.

In the example shown in FIG. 5A through FIG. 5F, a command (e.g., a write command) to store a corresponding information may be received. For example, commands to store information 410, 411, and 412 may be received at times T0, T2, and T4, respectively. Information can be concurrently stored in a target memory portion of memory location 401 and a memory portion of memory location 402 before the command to store additional information in the same target memory portion is received. For example, as shown in FIG. 5A, FIG. 5B, and FIG. 5C, information 410 can be stored (e.g., at time T1) in memory portion $402_0$ before the command to store information 411 is received (e.g., at time T2).

In the above description of storing information in memory location 401 and conditionally storing information in memory location 402, the storage capacity of each memory portion in memory location 401 is assumed to be two pages of information. The storage capacity, however, can be more than two pages of information.

FIG. 6A through FIG. 6F show variations of the examples of information stored in memory locations 401 and 402 of FIG. 5A through FIG. 5F, according to an embodiment of the invention. In the examples associated with FIG. 6A through FIG. 6F, the storage capacity of each of memory portions in memory location 401 is assumed to be three pages of information.

In FIG. 6A and FIG. 6B, information 410 can be stored in both memory locations 401 and 402 in the same way described above with reference to FIG. 5A and FIG. 5B.

FIG. 6C shows information 411 at time T2 to be stored in memory location 401. Since, the storage capacity of memory portion $401_0$ is not reached at time T2, memory portion $401_0$ is available to store more information. Thus, memory portion $401_0$ can be selected as a target memory location to store information 411 in addition to information 410. A determination can be made (e.g., at time T0) to determine whether information 411 is susceptible to being corrupted during storing of more information in memory location 401. Since, the storage capacity of memory portion $401_0$ is assumed to be three pages of information, the storage capacity of memory portion $401_0$ is not reached even after (e.g., after time T3) information 411 (associated with page $P_1$) is stored in memory portion $401_0$. Thus, memory portion $401_0$ can be available to store more information after information 411 is stored in it. Therefore, memory portion $401_0$ can be selected again at another time (e.g., time T2) as a target memory location to store additional information (e.g., information 412) in addition to information 410 and 411. However, storing additional information in the same memory portion $401_0$ after information 411 is stored in memory portion $401_0$ may corrupt information 410 and 411. Thus, at time T2, information 411 can be determined to be susceptible to being corrupted. Therefore, at time T2, the condition to store information 411 in memory location 402 is met. Thus, in addition to storing information 411 in memory location 401, information 411 can also be stored in memory location 402. FIG. 6D shows information 411 after it is stored in memory portion $401_0$ of memory location 401 and memory portion $402_1$ of memory location 402. Information 411 can be stored in memory location 402 concurrently with the storing of information 411 in memory location 401. For example, at time T3, information 411 can be concurrently stored in both memory locations 401 and 402.

FIG. 6E shows information 412 at time T4 to be stored in memory location 401. Since the storage capacity of memory portion $401_0$ is not reached at time T4, memory portion $401_0$ is available to store more information. Thus, memory portion $401_0$ can be selected as a target memory location to store information 412 in addition to information 410 and 411. A determination can be made (e.g., at time T4) to determine whether information 412 is susceptible to being corrupted during storing of more information in memory location 401. Since the storage capacity of memory portion $401_0$ is assumed to be three pages of information, memory portion $401_0$ may reach its storage capacity after information 412 (associated with page $P_2$) is stored in memory portion $401_0$. Thus, memory portion $401_0$ can be unavailable to store more information after information 412 is stored therein. Therefore, memory portion $401_0$ may not be selected as a target memory location to store more information in addition to information 410, 411, and 412. Thus, information 412 to be stored in memory location 401 can be determined to be not susceptible to being corrupted. Therefore, at time T4, the condition to store 412 in 402 is not met. Thus, as shown in FIG. 6F, information 412 can be stored (e.g., at time T5) in memory portion $401_0$ of memory location 401 without storing information 412 in memory location 402.

Figure 7:
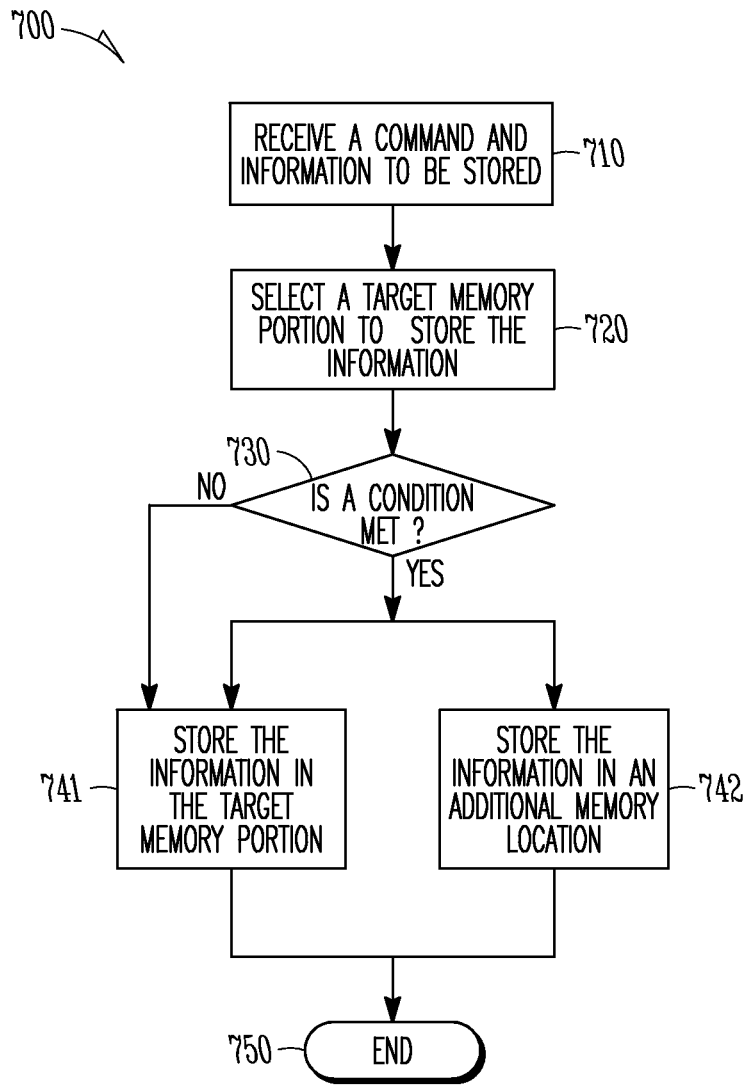
FIG. 7 is a flow diagram showing a method, according to an embodiment of the invention.

FIG. 7 is a flow diagram showing a method 700, according to an embodiment of the invention. Method 700 can be performed by an apparatus or part of the apparatus. For example, method 700 can be performed by memory device 101, memory controller 103, and/or processor 106 including management component 119 described above with reference to FIG. 1 through FIG. 6F.

Method 700 can include storing information in a memory location. Method 700 can also include conditionally storing the same information in another memory location if a condition is met. The memory locations used in method 700 can include memory locations 401 and 402 described above with reference to FIG. 4A through FIG. 6F. As shown in FIG. 7, method 700 can include activities 710, 720, 730, 741, 742, and 750.

Activity 710 can include receiving a command (e.g., a write command) to store information. Activity 710 can also include receiving information to be stored.

Activity 720 can include selecting a target memory portion of the memory location to store the information. The target memory portion can include an available memory portion among a number of memory portions of the memory location. For example, the target memory portion can be one of memory portions $401_0$ through $401_N$ of memory location 401 in FIG. 5A through FIG. 5F that is available to store the information.

Activity 730 can include determining whether a condition is met. As described above with reference to FIG. 1 through FIG. 6F, the condition can be based on a determination of whether the information is susceptible to being corrupted (e.g., at risk) when more information is stored in the target memory portion. For example, the condition in activity 730 is met if is it determined that the information is susceptible to being corrupted when more information is stored in the target memory portion.

In activity 730, the condition can also be based on whether the target memory portion is available to store more information in addition to the information received in activity 710. For example, the condition in activity 730 is met if the target memory portion is available to store more information in addition to the information received in activity 710. The condition in activity 730 is not met if the target memory portion is unavailable to store more information in addition to the information received in activity 710.

In activity 730, the condition can further be based on whether the target memory portion already has information stored therein before the information received in activity 710 is stored in the target memory portion. For example, the condition in activity 730 is met if the target memory portion has no stored information (e.g., is empty) before the information received in activity 710 is stored in the target memory portion.

If the condition in activity 730 is met (shown as "YES" in FIG. 7), method 700 performs activities 741 and 742. Activity 741 can include storing the information in the target memory portion. Activity 742 can include storing the information in an additional memory location. Method 700 can perform activities 741 and 742 concurrently. This may improve the performance (e.g., increase efficiency) of the apparatus used in method 700.

The target memory portion used in activity 741 can be included in a primary memory location (e.g., a primary block of memory) to store information. The additional memory location used in activity 742 may be used as a backup memory location (e.g., log memory location). Thus, the information stored in the additional memory location may be considered as backup information. As shown in FIG. 7, since method 700 may perform activities 741 and 742 concurrently, method 700 may store information in the additional memory location without copying the information from the target memory portion to the additional memory location.

If the condition in activity 730 is not met (shown as "NO" in FIG. 7), method 700 performs activity 741 without performing activity 742. Thus, if the condition is not met, method 700 can include storing the information in the target memory location without storing the information in another memory location.

Method 700 can end at activity 750 or repeat one or more of activity 710, 720, 730, 741, 742 to store more information.

Method 700 may include fewer or more activities than the activities shown in FIG. 7. For example, method 700 can include activities associated with the operations described above with reference to FIG. 1 through FIG. 6F. In another example, other activities of method 700 may include scanning the additional memory location (e.g., backup memory location). The scanning can be performed at every time interval (e.g., at a predetermined time interval) and/or each time the apparatus used in method 700 is powered-up (e.g., during a system boot up sequence).

Based on the scanning, method 700 may include determining whether the stored information (e.g., a lower page of information) in the additional memory location is also stored with accompanying information (e.g., an upper page of information) in the same target memory portion. If the accompanying information has been stored in the target memory portion and if the target memory portion has reached its storage capacity, then method 700 can include determining that the stored information (e.g., a lower page of information) in the additional memory location may no longer be susceptible to being corrupted. Thus, method 700 may include indicating that the stored information in the additional memory location is no longer needed (e.g., is invalid information). Method 700 may also include removing (e.g., erasing) stored information that has been indicated as no longer needed. This may increase available room in the additional memory location to store new information (e.g., new backup information).

If the accompanying information has not been stored in the target memory portion, then method 700 can include keeping the stored information (e.g., a lower page of information) in the additional memory location (e.g., keeping the stored information until it is indicated as no longer susceptible to being corrupted). Method 700 may also include keeping the stored information in the additional memory location (e.g., keeping the stored information until it is indicated as no longer susceptible to being corrupted) if the accompanying information has been stored in the target memory portion but the target memory portion still has not reached its storage capacity.

The illustrations of the apparatuses (e.g., apparatus 100) and methods (e.g., method 700 and operations performed by management component 119) are intended to provide a general understanding of the structure of various embodiments and are not intended to provide a complete description of all the elements and features of an apparatus that might make use of the structures described herein.

The apparatuses (e.g., apparatus 100 or part of the apparatus, e.g., memory device 101, memory controller 103, or processor 106, or part of memory device 101, part of memory controller 103, and/or part of processor 106, including management component 119 of FIG. 1) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments.

The apparatuses (e.g., apparatus 100) described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 7 include apparatuses and methods to select a target memory portion in a first memory location to store information. One such method can conditionally store the information in a second memory location when the information is stored in the target memory portion. Other embodiments, including additional apparatuses and methods, are described.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. A method comprising:
    selecting a target memory portion in a first memory location of a memory device to store information;
    storing information in the target memory portion; and
    conditionally storing the information in a second memory location of the same memory device when the information is stored in the target memory portion, wherein selecting the target memory portion is performed by part of a management component, the part of the management component being included either in the memory device or in a memory controller coupled to the memory device, and wherein storing the information in the target memory portion and conditionally storing the information in the second memory location are performed by the memory device.

2. The method of claim 1, wherein the conditional storing of the information in the second memory location is performed in response to a determination that the information is susceptible to being corrupted during storing of other information in the target memory portion.

3. The method of claim 1, wherein the information includes first information, the conditional storing of the information includes conditionally storing the first information in the second memory location, and the conditional storing of the first information in the second memory location is performed in response to a determination that the target memory portion is available to store second information in addition to the first information.

4. The method of claim 1, wherein the conditional storing of the information in the second memory location is performed in response to a determination that the target memory portion has no stored information before the information is stored in the target memory portion.

5. The method of claim 1, further comprising:
    indicating the information stored in the second memory location as no longer needed if the target memory portion has reached a storage capacity.

6. A method comprising:
    storing first information in memory cells of a first memory location of a memory device;
    storing the first information in a second memory location of the same memory device concurrently with the storing of the first information in the memory cells; and
    storing second information in the memory cells, wherein the first information remains stored in the memory cells after the second information is stored in the memory cells.

7. The method of claim 6, further comprising:
    storing the second information in the second memory location concurrently with the storing of the second information in the memory cells.

8. The method of claim 7, further comprising:
    storing third information in the memory cells, wherein the first information and the second information remain stored in the memory cells after the third information is stored in the memory cells.

9. A method comprising:
    receiving first information;
    selecting a target memory portion of a memory device to store the first information;
    storing the first information in the target memory portion; and
    storing the first information in an additional memory portion if the first information is determined to be susceptible to being corrupted when second information is stored in the target memory portion after the first information is stored in the target memory portion, wherein storing the first information in the additional memory portion is performed before receiving a command to store the second information in the target memory portion, and wherein selecting the target portion is performed by part of a management component, the part of the management component being included either in the memory device or in a memory controller coupled to the memory device, and wherein receiving the first information, storing the first information in the target memory portion and the additional memory portion are performed by the memory device.

10. The method of claim 9, wherein the first information is stored in the target memory portion currently with storing the first information in the additional memory portion.

11. The method of claim 10, wherein the first information is associated with a lower page among multiple pages of information to be stored in the target memory portion.

12. The method of claim 11, wherein the second information is associated with an upper page among the multiple pages.

13. An apparatus comprising:
    a first memory location of a memory device;
    a second memory location of the same memory device; and
    a module to store information in the first memory location and to conditionally store the information in the second memory location when the information is stored in the first memory location.

14. The apparatus of claim 13, wherein the module stores the information in the second memory location if the information is determined to be susceptible to being corrupted when other information is stored in the first memory location.

15. An apparatus comprising:
    a first memory location;
    a second memory location; and
    a module to store information in the first memory location and to conditionally store the information in the second memory location when the information is stored in the first memory location, wherein the module is configured to store the information in a target memory location of the first memory location, and to store the information in the second memory location if a storage capacity of the target memory portion is not reached after the information is stored in the target memory portion.

16. The apparatus of claim 13, wherein the module is configured to conditionally store additional information in the second memory location.

17. The apparatus of claim 16, wherein the second memory location includes first memory cells and second memory cells, and the module is configured to store the information in the first memory cells and to store the additional information in the second memory cells.

18. The apparatus of claim 13, wherein the apparatus comprises at least one of a memory device and a memory controller.

19. An apparatus comprising:
   a first memory location of a memory device;
   a second memory location of the same memory device; and
   a module to store first information in memory cells included in a memory portion of the first memory location and to store the first information in the second memory location if the memory portion of the first memory location is determined to be available to store second information.

20. The apparatus of claim 19, wherein the module is configured to store the first information in the second memory location without copying the first information from the first memory location to the second memory location.

21. The apparatus of claim 19, wherein the memory cells share a same access line.

\* \* \* \* \*